United States Patent [19]

Esterson et al.

[11] Patent Number: 4,672,340

[45] Date of Patent: Jun. 9, 1987

[54] MULTIPACTOR DISCHARGE TUNED RESONANT CAVITY DEVICES

[75] Inventors: Maurice Esterson, Chelmsford; Michael B. C. Brady, Maldon, both of England

[73] Assignee: English Electric Valve Company Limited, England

[21] Appl. No.: 43,471

[22] Filed: May 30, 1979

[30] Foreign Application Priority Data

May 30, 1978 [GB] United Kingdom ............... 24136/78

[51] Int. Cl.[4] .......................... H01P 1/14; H03B 9/10

[52] U.S. Cl. .............................. 333/231; 333/99 MP; 331/90; 315/39.57; 315/39.77

[58] Field of Search .................... 333/99 MP, 13, 231, 333/223; 315/39.55, 39.57, 39.77, 39.97; 331/90

[56] References Cited

U.S. PATENT DOCUMENTS

| | | | |
|---|---|---|---|
| 2,646,550 | 7/1953 | Varela | 333/99 MP |
| 2,674,694 | 4/1954 | Baker | 333/99 MP |
| 3,348,169 | 10/1967 | Tamiyasu | 333/99 MP |
| 3,967,155 | 6/1976 | Chavanat et al. | 333/99 MP |
| 4,066,988 | 1/1978 | Karp | 333/231 |
| 4,100,458 | 7/1978 | Pickering et al. | 333/99 MP |
| 4,105,951 | 8/1978 | Pickering et al. | 333/99 MP |
| 4,115,746 | 9/1978 | Brady et al. | 333/99 MP |

FOREIGN PATENT DOCUMENTS

| | | | |
|---|---|---|---|
| 2351390 | 2/1975 | Fed. Rep. of Germany | 315/39.55 |
| 1382630 | 2/1975 | United Kingdom | 333/99 MP |

OTHER PUBLICATIONS

Pickering, "Electronic Tuning of Magnetrons", 7/79, pp. 73–78, Microwave Journal.

Pickering, "Electronic Tuning of Magnetrons", 1978, pp. 98–102, Conf. on Military Microwaves, 1st London, Eng.

*Primary Examiner*—Nelson Moskowitz

*Attorney, Agent, or Firm*—John P. Snyder

[57] ABSTRACT

A resonant cavity device—particularly a magnetron oscillator—has a separate resonator coupled to a resonant cavity of the device. The separate resonator consists of a resonant transmission line within which are two multipactor discharge arrangements, one being positioned at a distance along a resonant transmission line which is approximately $3\lambda/4$ from the end of the transmission line adjacent the cathode and the other of which is positioned at a distance along the resonant transmission line which is $\lambda/4$ from the same end of the transmission line. By controlling the multipactor discharges of the multipactor discharge devices appropriately three different frequencies of operation are available.

2 Claims, 1 Drawing Figure

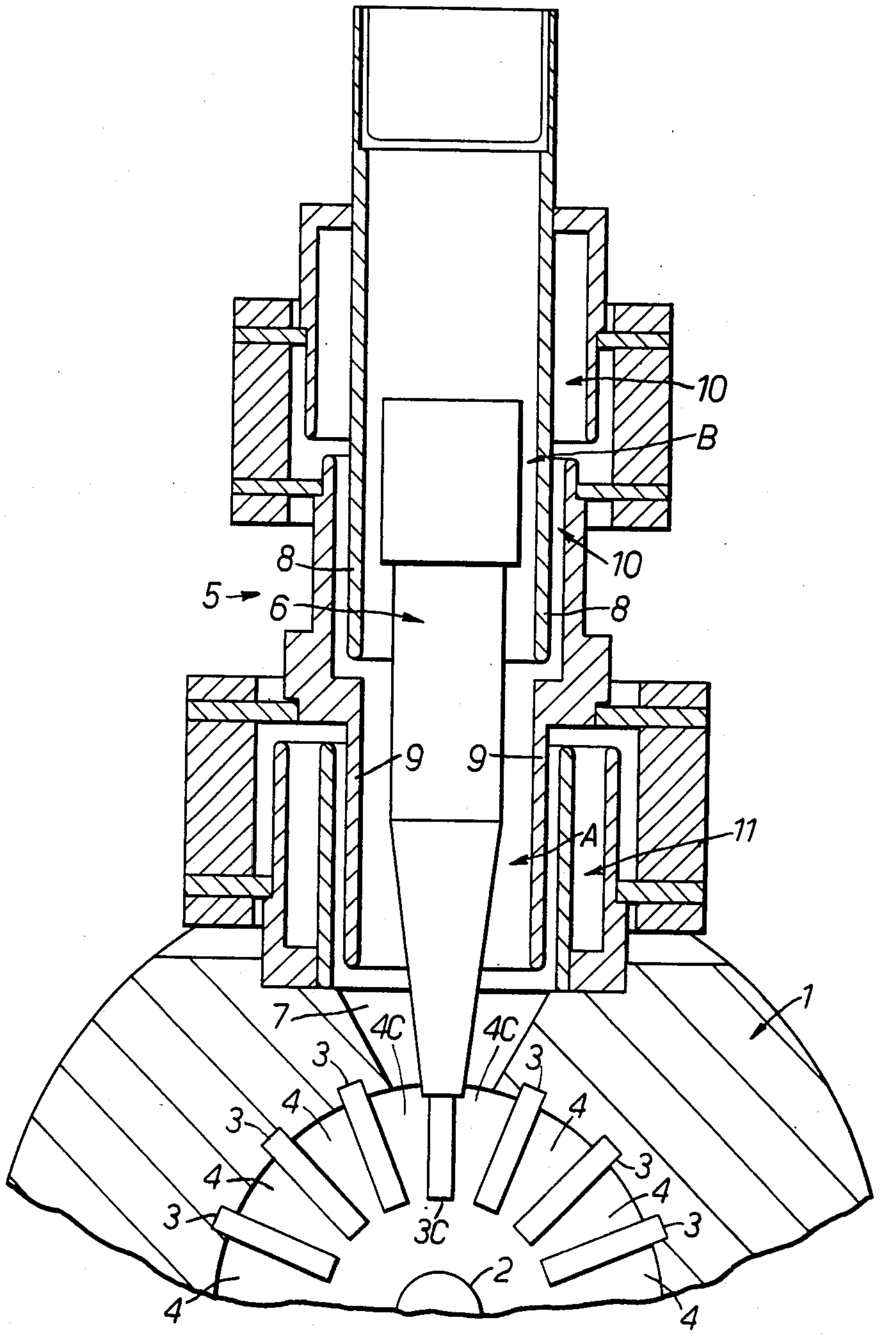
10
B
10
8
5
6
8
9
9
A
11
1
7
4C
4C
3
3
3
4
4
3
3
4
4
3
3
3C
2
4
4

MULTIPACTOR DISCHARGE TUNED RESONANT CAVITY DEVICES

This invention relates to multipactor discharge tuned resonant cavity devices and in particular to multipactor discharge tuned magnetron oscillators.

It is known from our U.K. patent specification No. 1,334,001, for example, to provide a separate resonator coupled to a cavity of a resonant cavity device (in this case a magnetron oscillator) with a multipactor discharge arrangement arranged to influence the separate resonator in such manner that when said multipactor discharge arrangement is permitted to discharge (usually by removing a bias voltage) the operating frequency of the resonant cavity device changes from one value to another.

In the case of a multi cavity magnetron oscillator, for example, it is known to provide a plurality of separate resonators each with a multipactor discharge arrangement arranged to influence the same and with separate bias control leads so that by effecting multipactor discharge in selected numbers of the separate resonators a selection of operating frequencies for the magnetron oscillator is provided.

There is, of course, a physical limit to the number of multipactor discharge influenced separate resonators which may be provided in any particular case and a disadvantage which arises in the provision of pluralities of multipactor discharge influenced separate resonators as at present known, is that each of these separate resonators introduces a degree of insertion loss.

One object of the present invention is to provide an improved multipactor discharge tuned resonant cavity device, and in particular a magnetron oscillator, in which the above difficulties are mitigated.

According to this invention a resonant cavity device is provided wherein at least one separate resonator is coupled to a resonant cavity of said device, said separate resonator comprises a resonant transmission path extending between a first multipactor discharge arrangement and said cavity and at least one further multipactor discharge arrangement provided to influence said separate resonator and positioned between said first multipactor discharge arrangement and said cavity.

Normally each multipactor discharge arrangement provided to influence a separate resonator is positioned at a point within the resonant transmission path thereof at which appears, in operation, a high radio frequency voltage and which is a quarter of a wavelength or an odd multiple thereof from the end of said transmission path adjacent said cavity.

In a preferred embodiment of the present invention two only multipactor discharge arrangements are located in a resonant transmission line of which a separate resonator comprises, one of said multipactor discharge arrangements being positioned at a distance along said resonant transmission line which is approximately 3λ/4 from the end of said transmission line adjacent said cavity and the other of said multipactor discharge arrangements being positioned at a distance along said resonant transmission line, which is approximately λ/4 from the end of said transmission line adjacent said cavity.

Where, as will often be the case, the resonant cavity device is a multi cavity device, a plurality of multipactor discharge influenced separate resonators may be provided each coupled to a different one of the resonant cavities of said device.

Preferably said resonant cavity device is a magnetron oscillator.

Preferably said resonant transmission path is a co-axial transmission line, the outer conductor of which terminates at the wall of the anode member of said magnetron oscillator and the inner conductor of which extends through an aperture provided in said wall, said inner conductor providing a common one electrode for all of the multipactor discharge arrangements along the length of said resonant transmission line. In order to isolate the multipactor discharge arrangements within the separate resonator in such a case so as to enable individual biasses to be applied to each multipactor discharge arrangement, preferably the outer conductor of said co-axial transmission line includes half wave chokes as required.

The invention is illustrated in and further described with reference to the accompanying drawing which is a section through part of one multipactor discharge tuned magnetron oscillator in accordance with the present invention.

Referring to the drawing, the magnetron oscillator will be seen to be of the vaned type. The arrangement consists of a cylindrical anode member 1 co-axially surrounding a cylindrical cathode member 2. From the anode member 1 radial vanes 3 extend inwardly. The anode member 1 with its vanes 3, together provide cavities 4 of which, in this example, there are sixteen in total, but only eight are shown. These cavities 4 determine the natural resonant frequency of the magnetron oscillator.

A separate resonator 5 is provided which consists essentially of a length of co-axial transmission line of which the central electrode 6 extends through a hole 7 in the anode wall 1 and is connected to one of the vanes 3, the reference numeral for which bears the suffix C. The hole 7 in the anode wall 1 breaks into two of the cavities 4 (again the reference numerals for these, bear the suffix C) on either side of the vane 3C, so that the transmission line couples to the two cavities 4C.

The central electrode 6 of the transmission line 5 forms a common electrode for two multipactor discharge arrangements. The first of these multipactor discharge arrangements has an individual second electrode 8, which forms one part of the outer conductor of the transmission line 5. This first mentioned multipactor discharge arrangement may be regarded as the main multipactor discharge arrangement and is positioned λ3/4 from the end of the transmission line adjacent the cavities 4C at which a high radio frequency voltage will appear in operation.

The second electrode for the other multipactor discharge arrangement is shown at 9 and forms another part of the outer conductor of the transmission line 5 nearer the anode wall of the magnetron oscillator. In fact, this second multipactor discharge arrangement is positioned at a distance λ/4 from the end of the resonant transmission line, where again the radio frequency voltage, in operation, is high.

As known per se on the surfaces of the electrode 8 and the central electrode 6 which face each other and similarly the surfaces of the electrode 9 and the central electrode 6 which face each other bear secondary emission material, as known per se, in order to promote the multipactor discharge effect.

In order to enable individual bias potentials to be applied to the electrodes 8 and 9, isolating λ/2 chokes 10 and 11 are provided in the outer wall of the transmission line 5. It will be seen that the λ/2 choke 11 is a folded one.

In operation, if it is assumed that no bias is applied to the electrodes 8 and 9 in order to inhibit multipactor discharge, it will be found that a multipactor discharge commences at A between electrode 9 and central electrode 6 and moves to point B between electrodes 8 and the central electrode 6 when the discharge at point A has lowered the voltage on the line sufficiently.

If bias is applied to electrode 9 no multipactor discharge can take place, since the multipactor discharge at point A is inhibited.

If bias is applied to electrode 8, but not to electrode 9, the multipactor discharge will start at point A, but cannot move to point B because of the bias applied to electrode 8 and approximately half of the full frequency change is obtained.

Thus, the two element multipactor discharge influenced separate resonator can provide three different frequencies and if N separate resonators are provided around the magnetron anode, each similar to the one described, a total of three to the power N selectable frequencies will be provided. Thus, the present invention may be used either to increase the number of selectable frequencies which physically can be provided or to reduce the insertion loss for a given number of selectable frequencies by reducing the number of separate multipactor discharge influenced resonators, which need to be provided.

We claim:

1. A resonant cavity device having extended tuning capability, which comprises in combination:

a resonant cavity structure having a resonant cavity and normally having a first resonant frequency; and means coupled with said resonant cavity for selectively causing said structure to resonate at one or the other of second and third frequencies different from each other and from said first resonant frequency, said means comprising a resonant transmission line coupled with said resonant cavity and two multipactor discharge devices serially spaced along said transmission line each at a position at which a high radio frequency voltage will appear in operation, a first of said multipactor discharge devices being spaced a first predetermined distance from said resonant cavity and a second of said multipactor discharge devices being spaced a second predetermined distance from said resonant cavity, said second distance being greater than said first distance, and each multipactor discharge device including a control electrode adapted to receive bias potential inhibiting its multipactor discharge, whereby bias applied to the control electrode of said first multipactor discharge device will inhibit multipactor discharge at either of said multipactor discharge devices and thus permit the resonant cavity device to resonate at said first frequency, bias applied to the control electrode of said second multipactor discharge device in the absence of bias at the control electrode of said first multipactor discharge device will inhibit multipactor discharge at said second multipactor discharge device and thus permit the resonant cavity device to resonate at said second frequency, and the absence of bias at both of said control electrodes will permit multipactor discharge at both of said multipactor discharge devices and thus permit the resonant cavity device to resonate at said third frequency.

2. A resonant cavity device as defined in claim 1 wherein said resonant transmission line comprises a coaxial line having a central electrode forming a common electrode for said two multipactor discharge devices and an outer coaxial electrode of which said control electrodes constitute separate parts.

* * * * *